(12) United States Patent
Kim

(10) Patent No.: US 9,978,428 B2
(45) Date of Patent: May 22, 2018

(54) SEMICONDUCTOR DEVICE AND POWER DISTRIBUTION NETWORK

(71) Applicant: SK hynix Inc., Icheon-si, Gyeonggi-do (KR)

(72) Inventor: Bum Su Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/485,344

(22) Filed: Apr. 12, 2017

(65) Prior Publication Data

US 2018/0068692 A1 Mar. 8, 2018

(30) Foreign Application Priority Data

Sep. 5, 2016 (KR) .................. 10-2016-0113924

(51) Int. Cl.
*G11C 11/40* (2006.01)
*G11C 5/06* (2006.01)
*G11C 5/14* (2006.01)
*G11C 5/02* (2006.01)
*H01L 27/108* (2006.01)
*G11C 11/4074* (2006.01)
*G11C 11/406* (2006.01)

(52) U.S. Cl.
CPC .............. *G11C 5/063* (2013.01); *G11C 5/025* (2013.01); *G11C 5/14* (2013.01); *H01L 27/10805* (2013.01); *G11C 11/406* (2013.01); *G11C 11/4074* (2013.01); *G11C 11/40615* (2013.01); *G11C 2211/4061* (2013.01)

(58) Field of Classification Search
CPC ............ G11C 11/406; G11C 11/40615; G11C 2211/4061
USPC .............................................. 365/185.25, 222
See application file for complete search history.

(56) References Cited

U.S. PATENT DOCUMENTS 7,426,130 B2 * 9/2008 Jeon ........................ G11C 11/22
365/145
8,901,704 B2 * 12/2014 Kang .................... H01L 27/105
257/499
2014/0126265 A1 * 5/2014 Lee ..................... G11C 13/0002
365/72

FOREIGN PATENT DOCUMENTS

KR 1020120004774 A 1/2012

* cited by examiner

*Primary Examiner* — Jason Lappas
(74) *Attorney, Agent, or Firm* — William Park & Associates Ltd.

(57) ABSTRACT

In a semiconductor device, some regions of a memory cell array region may be used as reservoir regions. A semiconductor device may include at least one reservoir cell disposed with the memory cells in a cell array region.

20 Claims, 8 Drawing Sheets

SEMICONDUCTOR DEVICE AND POWER DISTRIBUTION NETWORK

CROSS-REFERENCE TO RELATED APPLICATION

The priority of Korean patent application No. 10-2016-0113924 filed on 5 Sep. 2016, the disclosure of which is hereby incorporated in its entirety by reference, is claimed.

BACKGROUND

1. Technical Field

Embodiments of the present disclosure may generally relate to semiconductor device, and more particularly to a semiconductor device relating to a power distribution network (PDN).

2. Related Art

With the increase in the integration of semiconductor devices, demand for higher storage capacity and higher operation speed is rapidly increasing, such that semiconductor devices have been developed to have higher integration and higher storage capacity with higher speeds. Specifically, the penetration rate of mobile devices in the world is rapidly increasing, and the number of high-functional mobile devices is also rapidly increasing, such that higher-performance memory devices to be applied to the mobile devices are in demand.

As a result, the amount of power consumption in a semiconductor memory chip has been rapidly increased. If voltage drop occurs due to impedance of a power distribution line within the semiconductor memory chip, a voltage to be applied to actual elements of the semiconductor memory chip is greatly reduced as compared to a power-supply voltage supplied to the semiconductor memory chip, resulting in a negative influence upon circuit operational characteristics of the semiconductor memory chip.

In recent times, many developers and companies are conducting intensive research into power distribution network (PDN) technology to overcome power insufficiency encountered in operation of the semiconductor memory chip. Although various PDN design methods (e.g., decoupling capacitor arrangement, mesh-shaped power line arrangement, etc.) have been developed, there is a need to research and develop new PDN design methods to solve the overall voltage drop phenomenon of the semiconductor memory chip.

SUMMARY

In accordance with an aspect of the present disclosure, a semiconductor device may be provided. The semiconductor device may include a bit line formed to extend in a first direction. The semiconductor device may include a plurality of memory cells commonly coupled to the bit line. The semiconductor device may include at least one reservoir cell disposed between the memory cells, and electrically isolated from the bit line. The semiconductor device may include a first power line electrically coupled to the reservoir cell.

In accordance with an aspect of the present disclosure, a semiconductor device may include a plurality of memory cells located in a cell array region, and configured to store data in a capacitor. The semiconductor device may include a plurality of reservoir cells located in the cell array region in a manner that a capacitor of each reservoir cell may be coupled to a first power line.

DETAILED DESCRIPTION

Reference will now be made to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Various embodiments of the present disclosure may be directed to providing a semiconductor device for improving a power distribution network (PDN) that substantially obviates one or more problems due to limitations and disadvantages of the related art.

An embodiment of the present disclosure may relate to a semiconductor device configured to use some regions of a memory cell array region (i.e., MAT) as a reservoir capacitor region to effectively prevent deterioration of a power distribution network (PDN) contained in the mat region located far away from a pad acting as a power source.

Figure 1:
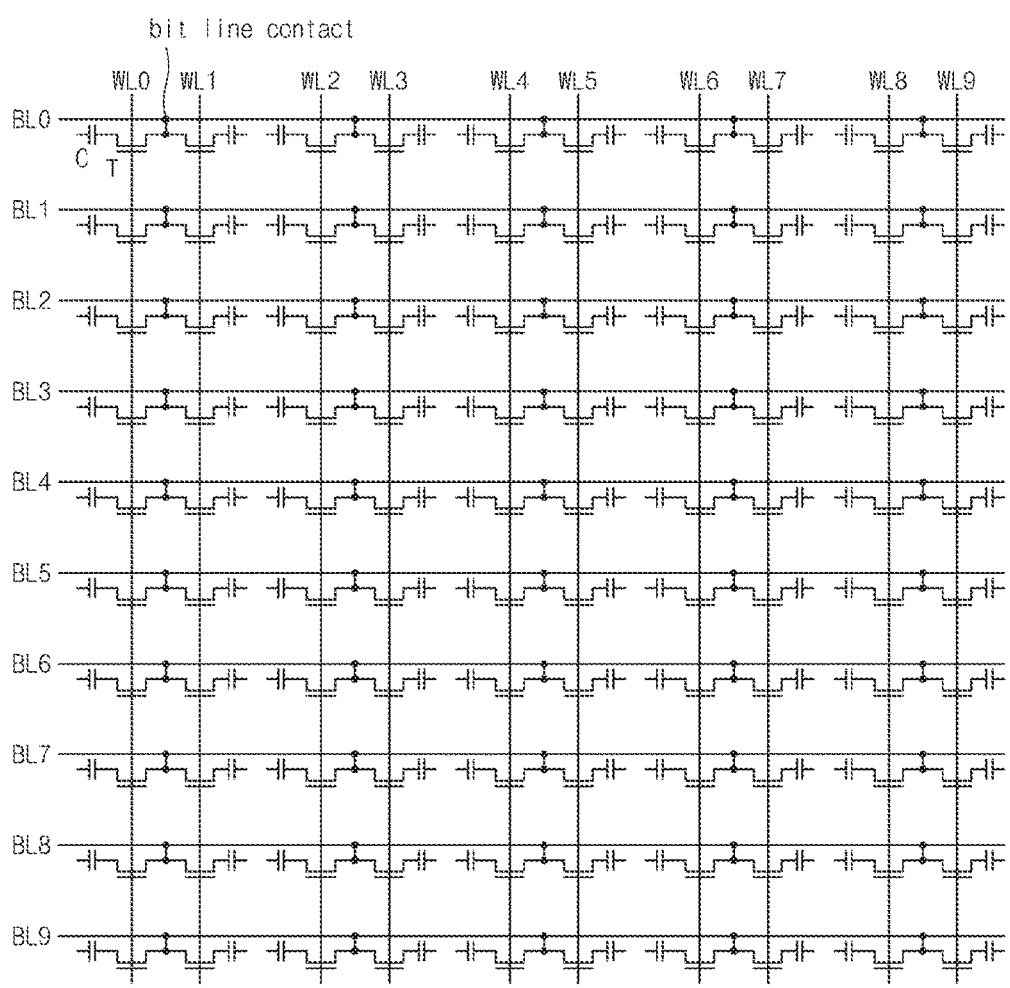
FIG. 1 is a circuit diagram illustrating a representation of an example of a cell array structure of a general semiconductor device according to an embodiment of the present disclosure.
Figure 2:
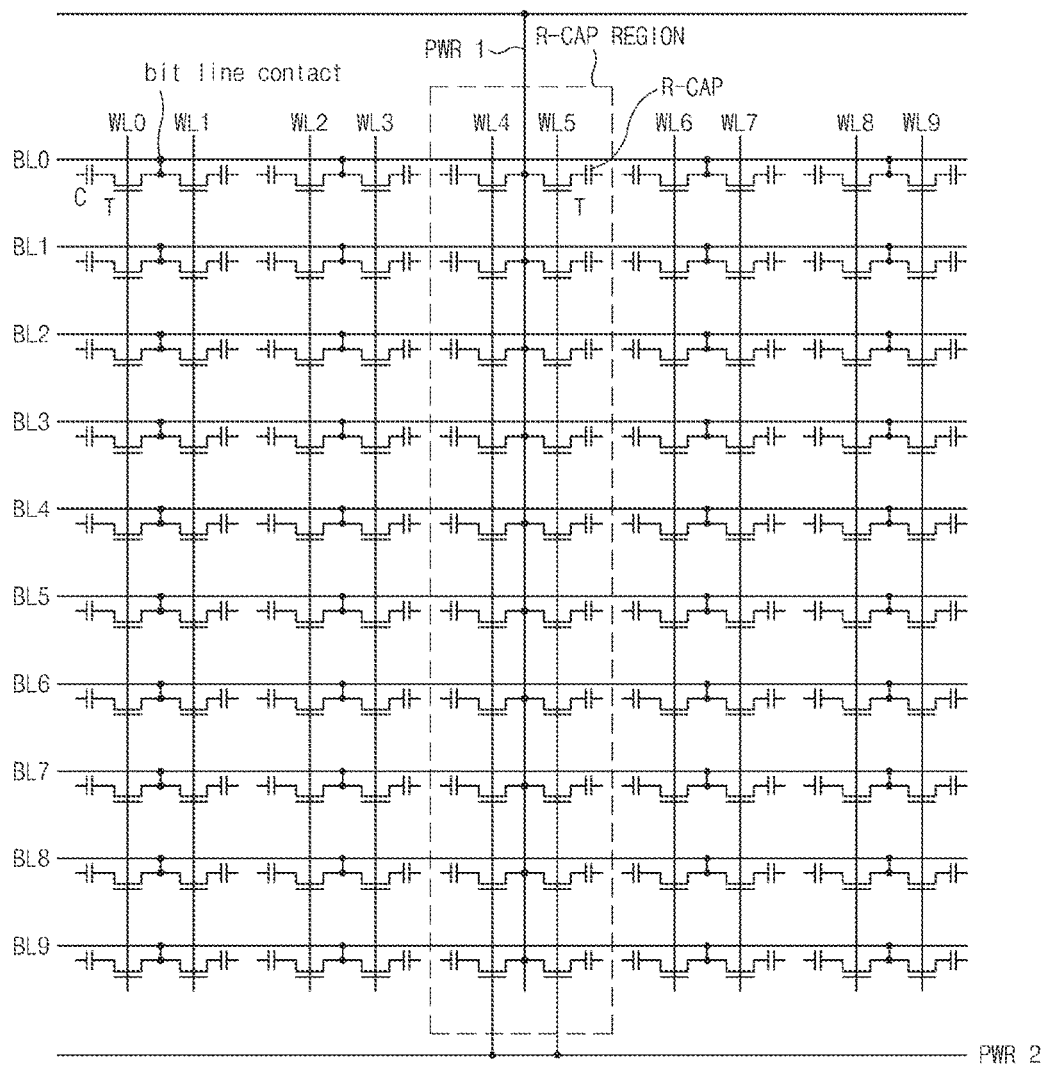
FIG. 2 is a circuit diagram illustrating a representation of an example of a cell array structure of a semiconductor device according to an embodiment of the present disclosure.

FIG. 1 is a circuit diagram illustrating a representation of an example of a cell array structure of a general semiconductor device according to an embodiment of the present disclosure. FIG. 2 is a circuit diagram illustrating a representation of an example of a cell array structure of a semiconductor device according to an embodiment of the present disclosure.

The cell array structure according to an embodiment of the present disclosure will hereinafter be described with reference to FIGS. 1 and 2.

A semiconductor device such as a dynamic random access memory (DRAM) may include a cell array in which memory cells for storing data therein are arranged in an array shape.

Each memory cell includes a 1-Transistor 1-Capacitor (1T1C)-type structure in which a single transistor acting as a switching device and a single capacitor for data storage are included.

In the above-mentioned cell array, word lines (i.e., WL0~WL9) configured to switch transistors on or off are spaced apart from one another by a predetermined distance in a first direction (i.e., a vertical direction of FIG. 1), and bit lines (i.e., BL0~BL9) configured to store data in capacitors as well as to read data stored in the capacitors are spaced apart from one another by a predetermined distance in a second direction (i.e., a horizontal direction of FIG. 1) perpendicular to the word lines (WL0~WL9). FIG. 1 illustrates, for example, word lines (WL0~WL9) and bit lines (BL0~BL9) for convenience of description and better understanding of the present disclosure. The number of word lines and bit lines illustrated may be more or less in other embodiments, and the embodiments are not limited by the number of word lines and bit lines illustrated.

Referring to FIG. 1, one pair of two memory cells is achieved, and transistors (T) of the corresponding memory cells may be coupled to bit lines (BL0~BL9) through a common node (bit line contact). In an embodiment, the transistor (T) of a memory cell is coupled between a capacitor (C) and the common node (bit line contact). In an embodiment, a cell may include the capacitor (C) and the transistor (T).

Compared with the cell array structure of FIG. 1, some cells of the cell array region (MAT) of the semiconductor device illustrated in FIG. 2 are used as reservoir cells for PDN improvement, instead of being used as memory cells for storing data. That is, some cells from among a plurality of cells contained in the cell array regions formed to have the same structure (in size and shape) through the same process may be used as reservoir cells. For example, cells coupled to some word lines (WL4 and WL5 in FIG. 2) arranged at the center part from among all word lines (WL0~WL9) of the cell array region are not used as memory cells, and are used as reservoir cells. In an embodiment, for example, at least one reservoir cell may be arranged in a line with memory cells.

Capacitors of the reservoir cells may be reservoir capacitors (R-CAP). In an embodiment, a reservoir cell may include a reservoir capacitor (R-CAP) and a transistor (T). In an embodiment, at least one reservoir cell may include reservoir cells disposed at both sides of the first power line (PWR 1) to be commonly coupled to the first power line (PWR 1). For example, a reservoir cell may include one reservoir capacitor (R-CAP) and one transistor (T) at both sides of the first power line (PWR 1) to be commonly coupled to the first power line (PWR 1). In this case, although word lines (WL4, WL5) are formed to have the same structure (in size and shape) through the same process as in other word lines (WL0~WL3, WL6~WL9), the word lines (WL4, WL5) are used as reservoir word lines having different functions.

For this purpose, reservoir cells coupled to the word lines (WL4, WL5) are not electrically coupled to bit lines (BL0~BL9), and are commonly coupled to a first power line (PWR 1). That is, capacitors of the reservoir cells are not coupled to bit lines (BL0~BL9) through transistors, and are coupled to the first power line (PWR 1). The first power line (PWR 1) may be a power-supply line for supplying a power-supply voltage to the reservoir capacitors (R-CAP). The first power line (PWR 1) may be arranged parallel to or substantially parallel to reservoir word lines (WL4, WL5) within the reservoir capacitor (R-CAP) region, and may be disposed between the reservoir word lines (WL4, WL5).

The word lines (WL0~WL3, WL6~WL9) may be coupled to a row decoder (not illustrated) to selectively receive a gate voltage from the row decoder. The reservoir word lines (WL4, WL5) may be coupled to the second power line (PWR 2) such that the reservoir word lines (WL4, WL5) may always receive the gate voltage. Therefore, transistors of the reservoir cells coupled to the reservoir word lines (WL4, WL5) may always be switched on. That is, capacitors of the reservoir cells located in the reservoir capacitor (R-CAP) region may be electrically coupled to the first power line (PWR 1) through transistors, and may serve as reservoir capacitors instead of the cell capacitors upon receiving a power-supply voltage from the first power line (PWR 1). In an embodiment, for example, a transistor (T) of the reservoir cell is maintained in a constant switched on state by receiving a constant gate voltage from the second power line (PWR 2). In an embodiment, for example, a transistor (T) of the reservoir cell is maintained in a constant switched on state by receiving a constant gate voltage from the second power line (PWR 2) during an operation mode.

Although the above-mentioned embodiments have disclosed, for example, that word lines located at the center part from among all word lines (WL0~WL9) of the cell array region are used as reservoir word lines, the position of such word lines are not limited to the center part. In addition, although the above-mentioned embodiments have disclosed, for example, that only two word lines (WL4, WL5) are used as reservoir word lines, the number of word lines may be increased or reduced as necessary. In an embodiment, a first reservoir word line (i.e., WL4) and a second reservoir word line (i.e., WL5) may be symmetrically or substantially symmetrically located at both sides of the first power line (PWR 1). In an embodiment, the word lines arranged at both sides of the reservoir word line or reservoir word lines may be symmetrically arranged or substantially symmetrically arranged at both of the sides of the reservoir word line or reservoir word lines.

Figure 3:
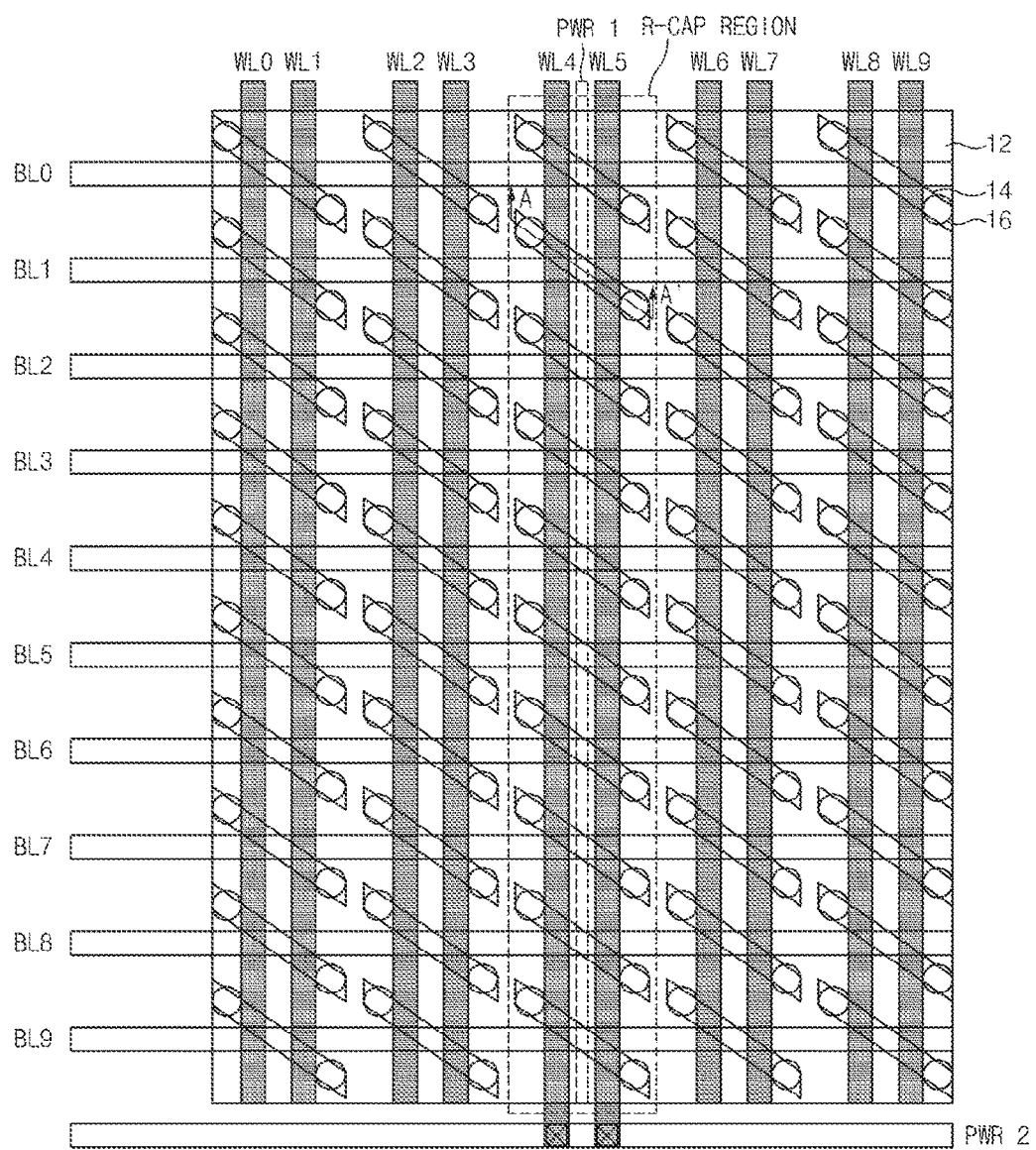
FIG. 3 is a plan view illustrating a representation of an example of the cell array structure of FIG. 2.
Figure 4:
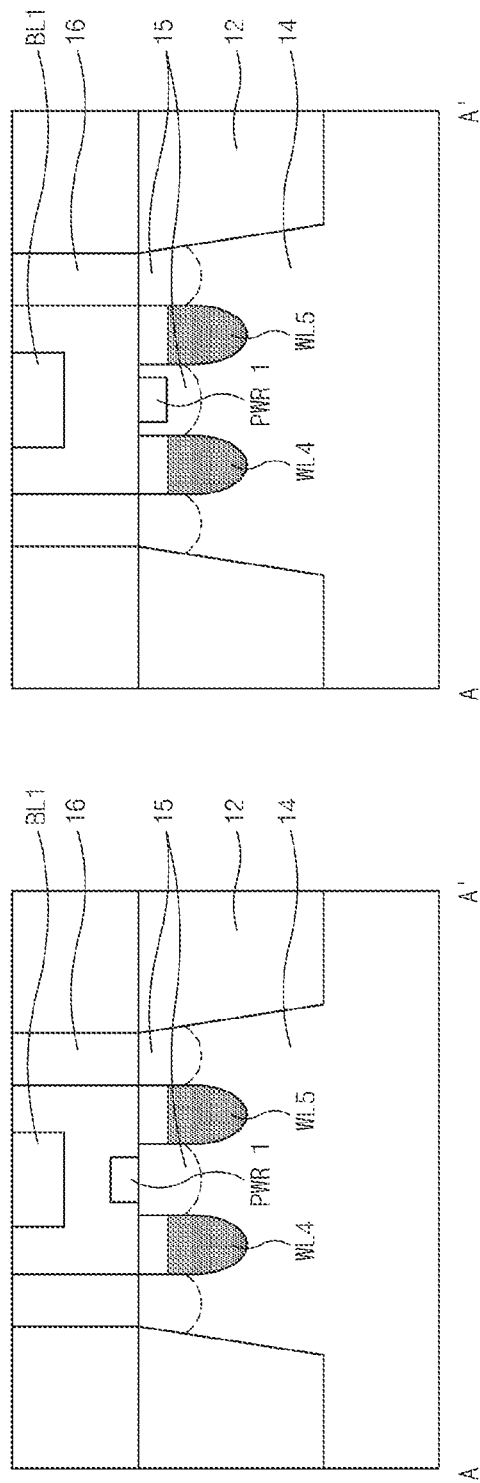
FIGS. 4A and 4B are cross-sectional views illustrating representations of examples of the cell array structure taken along the line A-A' of FIG. 3.

FIG. 3 is a plan view illustrating a representation of an example of the cell array structure of FIG. 2. FIGS. 4A and 4B are cross-sectional views illustrating representations of examples of the cell array structure taken along the line A-A' of FIG. 3.

Referring to FIG. 3, active regions 14 defined by a device isolation film 12 may be obliquely arranged at intervals of a predetermined distance. The respective active region 14 may be formed to cross two word lines and one bit line, and word lines (WL0~WL9) may be buried in the active region 14 as illustrated in FIGS. 4A and 4B.

Each active region 14 may be divided into three regions by two word lines formed to cross each other. In this case, the center region from among the divided regions may be coupled to the bit line, and both regions may be coupled to capacitors.

However, the active regions 14 of the reservoir capacitor (R-CAP) region according to an embodiment are not electrically coupled to bit lines (BL0~BL9). That is, as illustrated in FIGS. 4A and 4B, although a storage node contact 16 to be coupled to the capacitor is formed over the active regions of the reservoir capacitor (R-CAP) region, a bit line contact to be coupled to the bit line is not formed.

However, the first power line (PWR 1) may be formed in the active regions 14 of the reservoir capacitor (R-CAP) region. Here, the first power line (PWR 1) may be disposed between the reservoir word lines (WL4, WL5), and may be arranged parallel or substantially parallel to the reservoir word lines (WL4, WL5). For example, the first power line (PWR 1) may be formed over the active region 14 to be coupled to a junction 15 as illustrated in FIG. 4A, or may be formed over the active region 14 to be coupled to the junction 15 as illustrated in FIG. 4B. That is, one of the junctions (source/drain) of the transistor of the reservoir cell may be coupled to a capacitor (not illustrated) through a storage node contact 16, and the other one of the junctions (source/drain) of the transistor of the reservoir cell may be coupled to the first power line (PWR 1).

The reservoir word lines (WL4, WL5) may be coupled to the second power line (PWR 2), and may always receive a gate voltage, such that each transistor of the reservoir cell may always remain turned on. The second power line (PWR 2) may be a metal line formed over the bit lines (BL0~BL9), and may be coupled to reservoir word lines (WL4, WL5) through a contact (i.e., as indicated by 'x' of FIG. 3).

Figure 5:
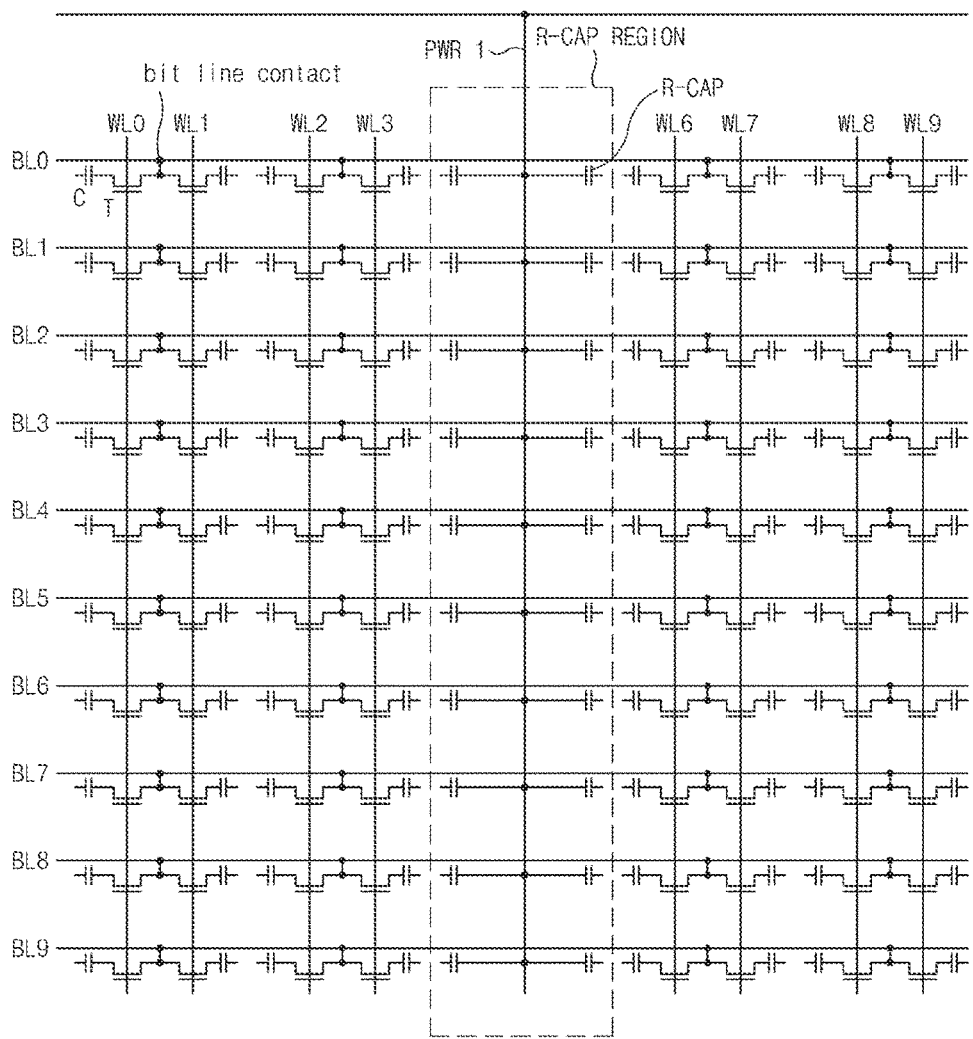
FIG. 5 is a circuit diagram illustrating a representation of an example of a cell array structure of a semiconductor device according to an embodiment of the present disclosure.

FIG. 5 is a circuit diagram illustrating a representation of an example of a cell array structure of a semiconductor device according to an embodiment of the present disclosure.

Compared with the cell array structure of FIG. 2, for example, the reservoir word lines (WL4, WL5) illustrated in FIG. 5 are not present in the reservoir capacitor (R-CAP) region. Referring to FIG. 5, reservoir cells located in the reservoir capacitor (R-CAP) region may include only capacitors instead of transistors, and the capacitors may be directly coupled to the first power line (PWR 1) without passing through the transistors. In an embodiment, for example, the capacitors of the reservoir capacitor (R-CAP) region are directly connected to the first power line (PWR 1) without the transistors. In an embodiment, a reservoir cell may include a reservoir capacitor (R-CAP). In an embodiment, at least one reservoir cell may include reservoir cells disposed at both sides of the first power line (PWR 1) to be commonly coupled to the first power line (PWR 1). For example, a reservoir cell may include one reservoir capacitor (R-CAP) at both sides of the first power line (PWR 1) to be commonly coupled to the first power line (PWR 1).

Accordingly, for example, the second power line (PWR 2) may not be present in the embodiment of FIG. 5.

Figure 6:
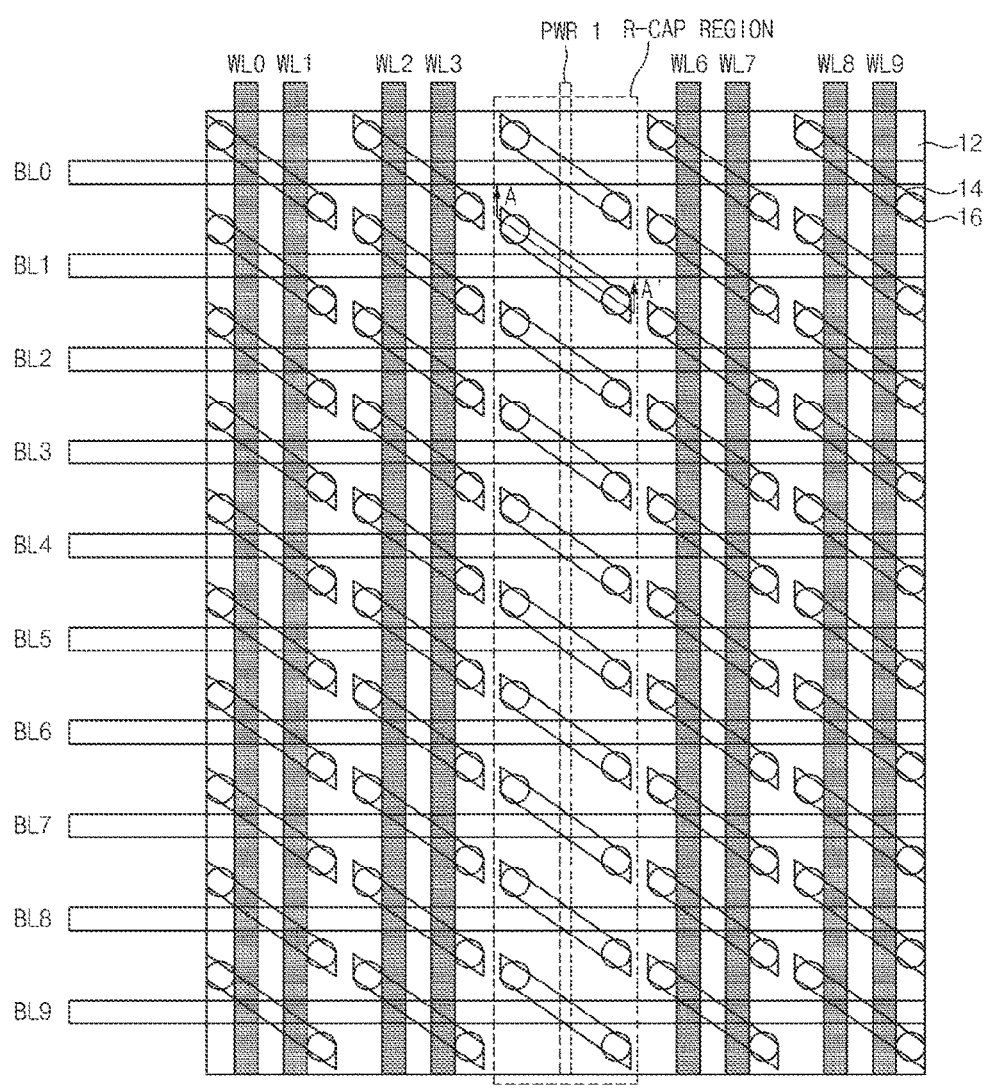
FIG. 6 is a plan view illustrating a representation of an example of the cell array structure of FIG. 5.
Figure 7:
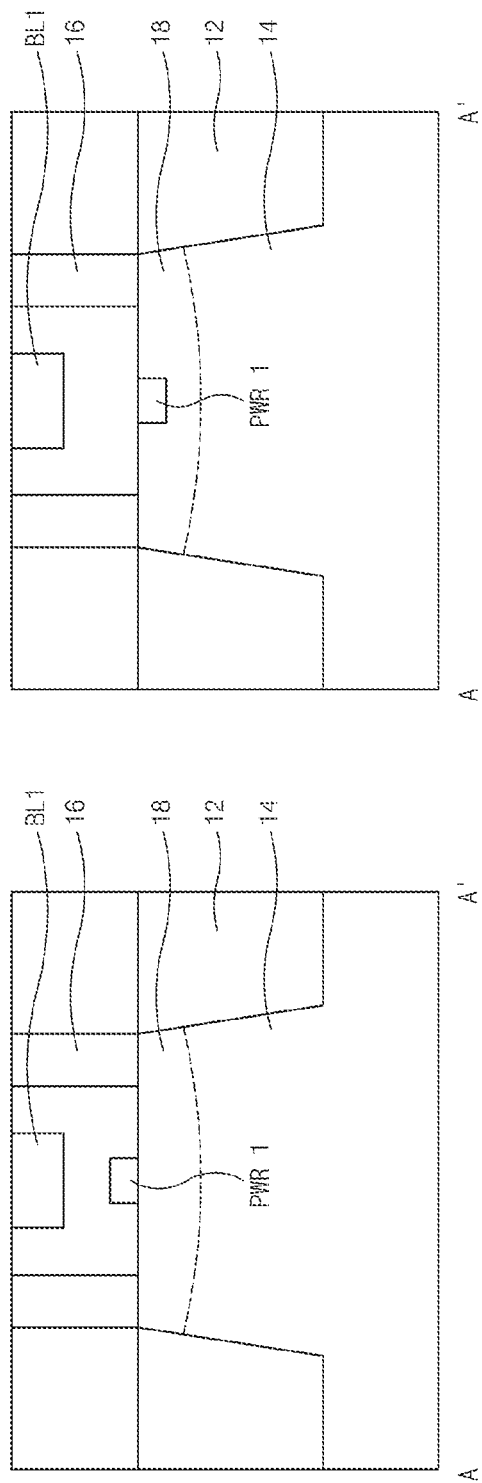
FIGS. 7A and 7B are cross-sectional views illustrating representations of examples of the cell array structure taken along the line A-A' of FIG. 6.

FIG. 6 is a plan view illustrating a representation of an example of the cell array structure of FIG. 5. FIGS. 7A and 7B are cross-sectional views illustrating representations of examples of the cell array structure taken along the line A-A' of FIG. 6.

For example, the first power line (PWR 1) of FIG. 6 may be formed in the reservoir capacitor (R-CAP) region, and reservoir word lines (WL4, WL5) of FIG. 6 may not be formed in the reservoir capacitor (R-CAP) region. However, a structure for electrically coupling the first power line (PWR 1) to capacitors of the reservoir cells may be formed in the active regions 14 of the reservoir capacitor (R-CAP) region.

A conductive material may be formed between the storage node contact 16 and the first power line (PWR 1) in such a manner that the storage node contact 16 is electrically coupled to the first power line (PWR 1). For example, as illustrated in FIGS. 7A and 7B, impurities are implanted into an upper portion of each active region 14, resulting in formation of a conductive layer 18.

For example, the first power line (PWR 1) may be formed over the active region 14 such that the first power line (PWR 1) is coupled to the conductive layer 18 as illustrated in FIG. 7A. The first power line (PWR 1) may be formed in the active region 14 such that the first power line (PWR 1) is buried in the conductive layer 18 as illustrated in FIG. 7B.

As is apparent from the above descriptions, the semiconductor devices according to the embodiments may effectively prevent PDN deterioration from occurring in a mat located far from a pad acting as a power source.

Figure 8:
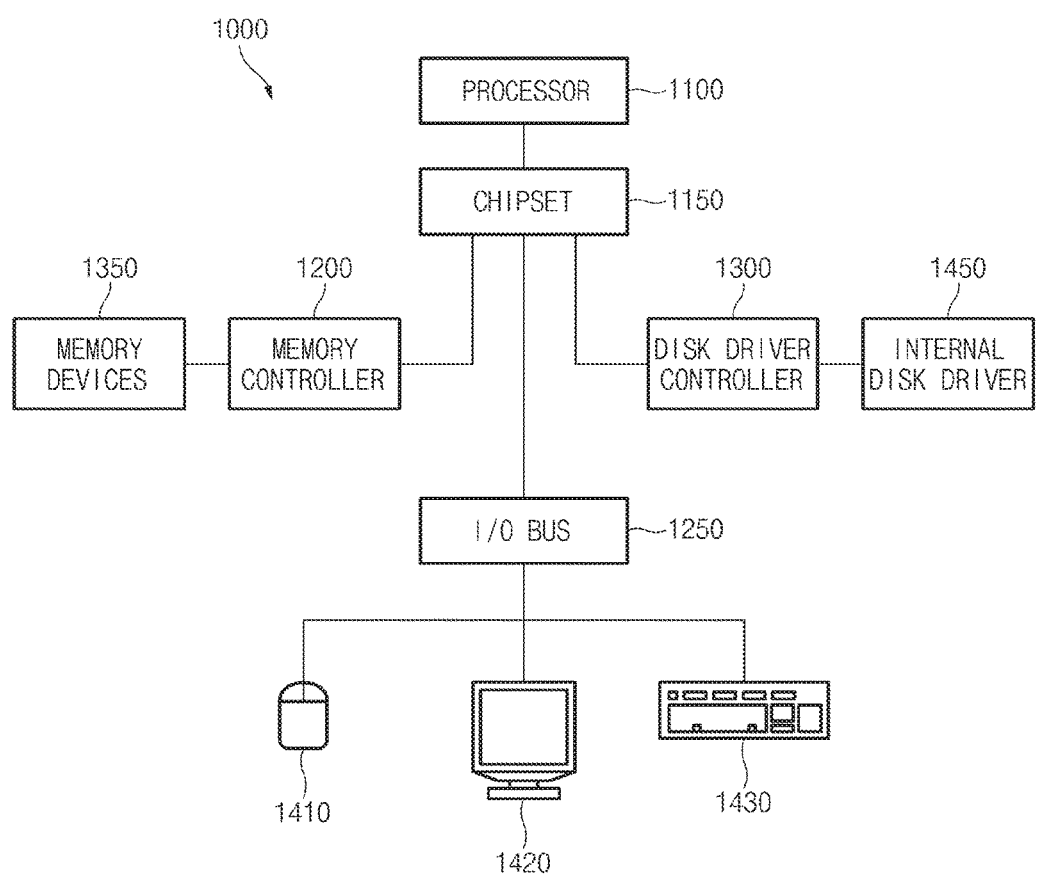
FIG. 8 illustrates a block diagram of an example of a representation of a system employing a cell array structure of a semiconductor device with the various embodiments discussed above with relation to FIGS. 2-7B.

The cell array structures and or cell array structures of the semiconductor devices as discussed above (see FIGS. 2-7B) are particular useful in the design of other memory devices, processors, and computer systems. For example, referring to FIG. 8, a block diagram of a system employing a cell array structure and or cell array structure of a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one cell array structure and or cell array structure of a semiconductor device as discussed above with reference to FIGS. 2-7B. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one cell array structure and or cell array structure of a semiconductor device as discussed above with relation to FIGS. 2-7B, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 8 is merely one example of a cell array structure and or cell array structure of a semiconductor device as discussed above with relation to FIGS. 2-7B. In alternate embodiments, such as, for example but not limited to, cellular phones or digital cameras, the components may differ from the embodiments illustrated in FIG. 8.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor are the embodiments limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a bit line formed to extend in a first direction;
   a plurality of memory cells commonly coupled to the bit line;
   at least one reservoir cell disposed between the memory cells, and electrically isolated from the all bit lines; and
   a first power line electrically coupled to the reservoir cell.

2. The semiconductor device according to claim 1, wherein the at least one reservoir cell and the memory cells are arranged in a line.

3. The semiconductor device according to claim 1, wherein the first power line is formed to extend in a second direction substantially perpendicular to the bit line.

4. The semiconductor device according to claim 3, wherein the at least one reservoir cell includes:
   reservoir cells disposed at both sides of the first power line to be commonly coupled to the first power line.

5. The semiconductor device according to claim 1, further comprising:
   a plurality of word lines extending to cross the bit line, and respectively coupled to the memory cells; and
   at least one reservoir word line disposed between the word lines in parallel to the word lines, and coupled to the at least one reservoir cell.

6. The semiconductor device according to claim 5, wherein the at least one reservoir word line is coupled to a second power line to receive a gate voltage.

7. The semiconductor device according to claim 5, wherein the at least one reservoir word line includes:
   a first reservoir word line and a second reservoir word line substantially symmetrically located at both sides of the first power line.

8. The semiconductor device according to claim 7, wherein the first power line is buried in an active region disposed between the first reservoir word line and the second reservoir word line.

9. The semiconductor device according to claim 7, wherein the first power line is disposed over an active region disposed between the first reservoir word line and the second reservoir word line.

10. The semiconductor device according to claim 5, wherein the plurality of word lines are substantially symmetrically arranged at both sides of the at least one reservoir word line.

11. The semiconductor device according to claim 1, wherein the reservoir cell includes:
    a reservoir capacitor; and
    a transistor, a junction of which is coupled to the reservoir capacitor and the first power line.

12. The semiconductor device according to claim 11, wherein the transistor always remains turned on during an operation mode.

13. The semiconductor device according to claim 1, wherein the reservoir cell includes:
    a reservoir capacitor; and
    a conductive layer configured to electrically couple the reservoir capacitor to the first power line.

14. The semiconductor device according to claim 13, wherein the conductive layer includes:
    an impurity region in which impurities are implanted in an active region.

15. A semiconductor device comprising:
    a plurality of memory cells located in a cell array region, and coupled to a bit line and configured to store data in a capacitor; and
    a plurality of reservoir cells located in the cell array region in a manner that a capacitor of each reservoir cell is coupled to a first power line and isolated from all bit lines.

16. The semiconductor device according to claim 15, further comprising:
    a plurality of word lines arranged in a first direction, and coupled to the memory cells; and
    at least one reservoir word line arranged in the first direction, and coupled to the reservoir cells.

17. The semiconductor device according to claim 16, wherein the at least one reservoir word line is coupled to a second power line to receive a gate voltage.

18. The semiconductor device according to claim 17, wherein the reservoir cell includes:
    a reservoir capacitor; and
    a transistor, a junction of which is coupled to the reservoir capacitor and the first power line.

19. The semiconductor device according to claim 15, wherein the reservoir cell includes:
    a reservoir capacitor; and
    a conductive layer configured to electrically couple the reservoir capacitor to the first power line.

20. The semiconductor device according to claim 19, wherein the conductive layer includes:
    an impurity region in which impurities are implanted in an active region.

* * * * *